United States Patent
Watanabe et al.

(10) Patent No.: US 7,154,070 B2
(45) Date of Patent: Dec. 26, 2006

(54) HEATER PLATE AND A METHOD FOR MANUFACTURING THE HEATER PLATE

(75) Inventors: Katsumi Watanabe, Tokyo (JP); Akira Fukuchi, Tokyo (JP)

(73) Assignee: Furukawa-Sky Aluminum Corp. (JP)

( * ) Notice: Subject to any disclaimer, the term of this patent is extended or adjusted under 35 U.S.C. 154(b) by 0 days.

(21) Appl. No.: 11/060,345

(22) Filed: Feb. 17, 2005

(65) Prior Publication Data

US 2006/0076342 A1     Apr. 13, 2006

Related U.S. Application Data

(60) Provisional application No. 60/617,114, filed on Oct. 8, 2004.

(51) Int. Cl.
*H05B 3/68* (2006.01)

(52) U.S. Cl. .................... 219/444.1; 219/544

(58) Field of Classification Search ............. 219/443.1, 219/444.1, 450.1, 465.1, 466.1, 467.1, 468.1, 219/468.2, 535, 544; 29/610.1, 611, 842, 29/843, 844, 845

See application file for complete search history.

(56) References Cited

U.S. PATENT DOCUMENTS

| | | | | |
|---|---|---|---|---|
| 2,875,312 A | * | 2/1959 | Norton | 219/535 |
| 2,987,300 A | * | 6/1961 | Greene | 165/169 |
| 6,376,815 B1 | * | 4/2002 | Watanabe | 219/538 |

FOREIGN PATENT DOCUMENTS

JP       2003-311932       11/2000

* cited by examiner

*Primary Examiner*—Sang Paik
(74) *Attorney, Agent, or Firm*—Cantor Colburn LLP

(57) ABSTRACT

A heater plate manufactured by receiving a sheath heater within a groove portion formed in a base member made of aluminum or aluminum alloy, placing a joint member made of aluminum or aluminum alloy into said groove portion so as to fix said sheath heater in the groove portion, and press-forging said base member and said joint member to be metal-bonded with said sheath heater fixed in place therebetween, wherein a cross section of said joint member comprises a rectangle, and a width of said rectangle is same as or a little larger than a width of a cross section of the groove portion.

32 Claims, 6 Drawing Sheets

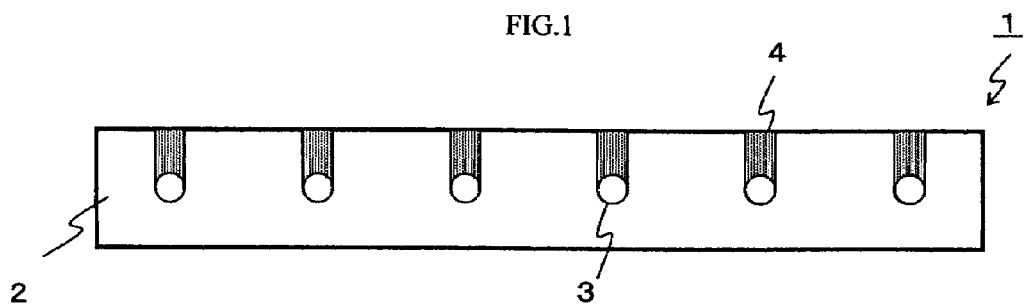
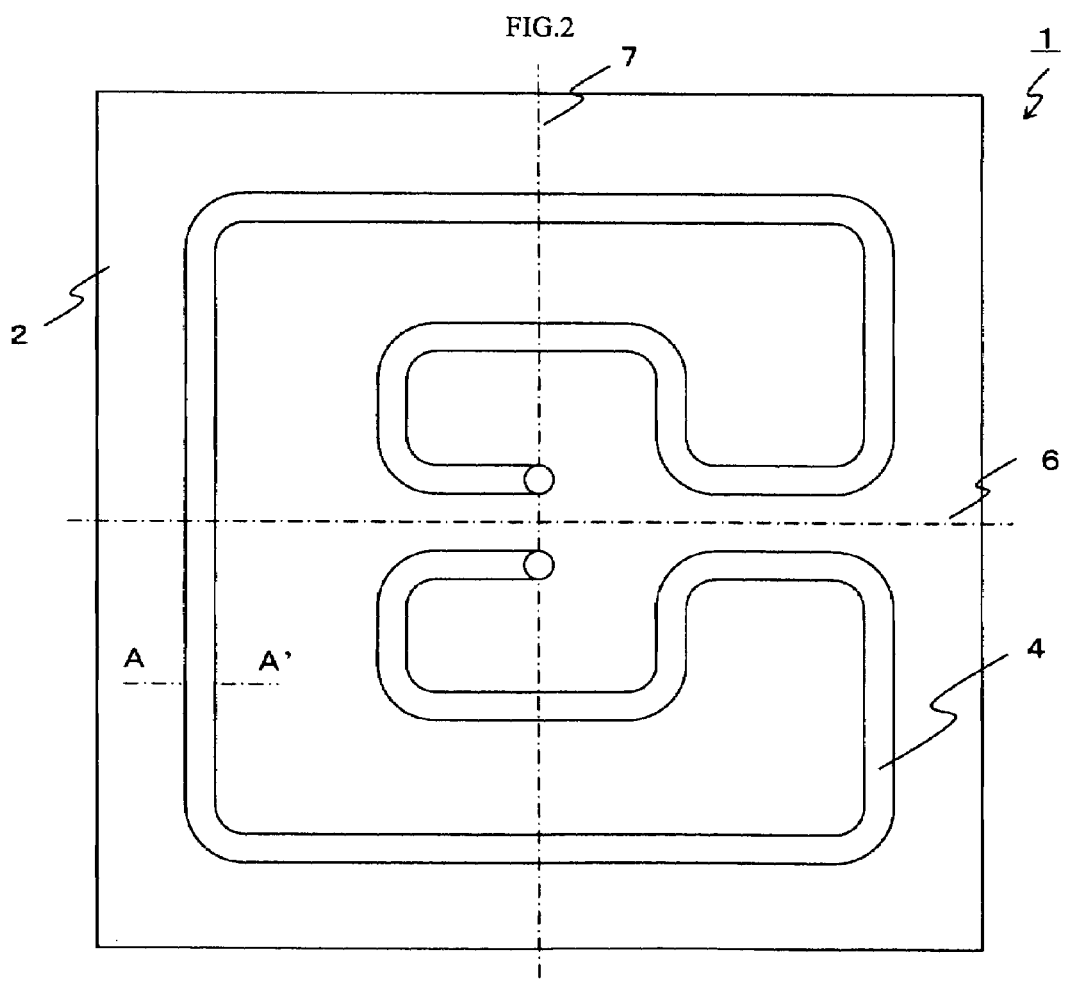

FIG.5
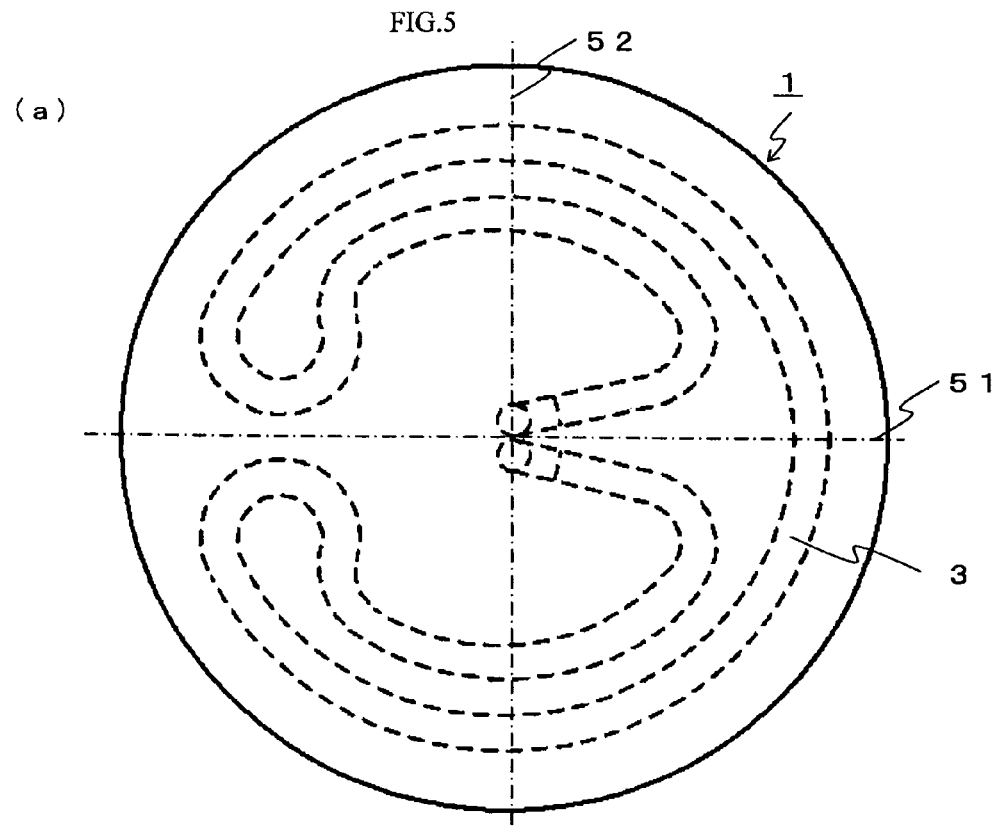
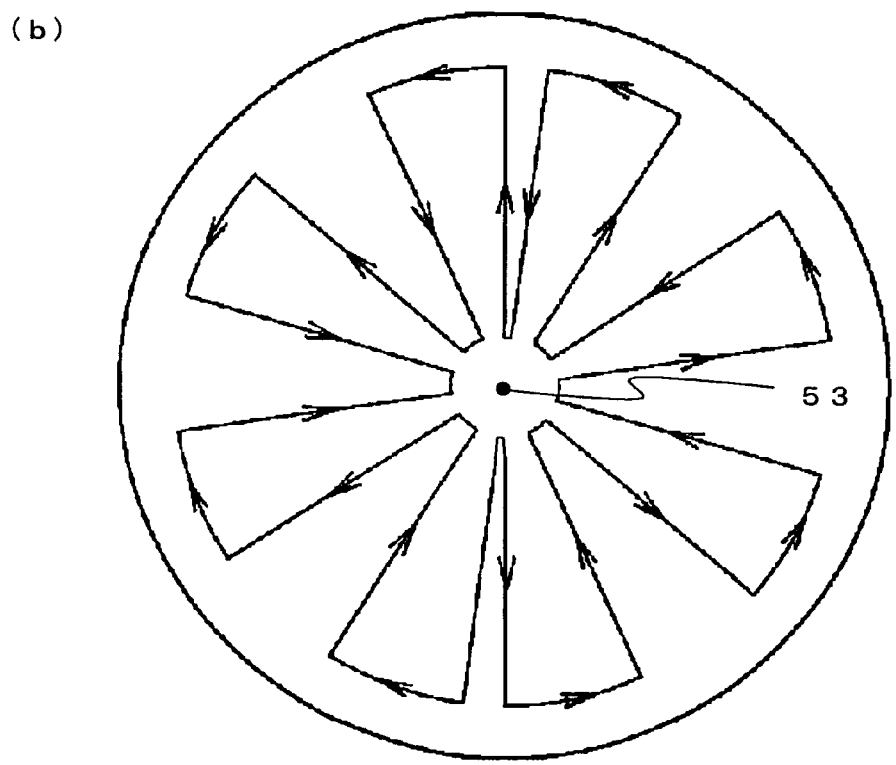

HEATER PLATE AND A METHOD FOR MANUFACTURING THE HEATER PLATE

CROSS REFERENCE TO RELATED APPLICATIONS

This application claims the benefits of U.S. Provisional Application Ser. No. 60/617,114 filed Oct. 8, 2004, which is fully incorporated herein by reference.

FIELD OF THE INVENTION

The present invention relates to a heater plate for manufacturing a semiconductor or liquid crystal display containing a sheath heater used as heated in a vacuum container (vacuum chamber) in particular, and a heater plate used for drying, preheating in the step of manufacturing the display, and a manufacturing method of the heater plate. In addition, the heater plate can be used for a heater plate for manufacturing a thin type display such as a PDP (plasma Display Panel), FED (Field Emission Display), or ELD (Electro Luminescence Display). Furthermore, the invention can be applied to a general heater plate such as a heater plate for manufacturing a PTP sheet.

RELATED ART

A heater plate containing a heater within a metal base was widely used in a various technical fields such as an apparatus for manufacturing a semiconductor or liquid crystal display. In general, a sheath heater made of stainless steel is used as the heater for the heater plate. As defined by its construction, there can be found the following heater plates: a sheath heater is cast in aluminum (i.e., cast type heater plate), a sheath heater is sandwiched by stainless steel plates and fastened by the screw bolts (i.e., bolt fastening type heater plate), a sheath heater is sandwiched by the plates and welded in the periphery thereof (i.e., welding type heater plate), a sheath heater is sandwiched and soldered or soldered and diffusion bonded by pressing under vacuum or a prescribed gas atmosphere (i.e., solder, diffusion bonded type heater plate), or a sheath heater is sandwiched by the plates, then corresponding enclosing groove portion and enclosing protruding portion are formed in the entire periphery of the plates, and the plates with the groove portion and the protruding portion are forge-compressed to be bonded (i.e., press-forging type heater plate).

FIG. 7 is a schematic cross sectional view showing the construction of the conventional cast type heater plate 101 containing the sheath heater 102 therein. A heat generating body is introduced into a protective pipe made of stainless steel, and electrically insulated therebetween by an insulating material, thus the sheath heater 102 is prepared. The prepared pipe type sheath heater 102 is bent in accordance with a prescribed pattern and cast in the aluminum base, then cut into a desired form, and the surface thereof is ground, additional workings are applied if necessary, to manufacture the heater plate 101.

FIG. 8 is a schematic cross sectional view showing the construction of the conventional bolt fastening type heater plate 103. In this construction, the metal base is divided into two, i.e., an upper base member and a lower base member. The same kind of the sheath heater 102 as described above is placed in groove portions 104a formed in the lower base member 104 made of aluminum, stainless steel or the like, then the upper base member 105 is fitted in a close contact manner to the lower base member with the sheath heater, and then fastened by screw bolts at appropriate positions so as to be integrated into a unit.

FIG. 9 is a schematic cross sectional view showing the construction of the conventional welding type heater plate 106. In this construction, the metal base is also divided into two, i.e., an upper base member and a lower base member. The same kind of the sheath heater 102 as described above is placed in groove portions 107a formed in the lower base member 107 made of aluminum, stainless steel or the like, then the upper base member 108 is fitted in a close contact manner to the lower base member with the sheath heater, and then welded at only end peripheral portions 109 thereof so as to be integrated into a unit.

FIG. 10 is a schematic cross sectional view showing the construction of the conventional solder, diffusion bonded type heater plate 110. In this construction, the metal base is also divided into two, i.e., an upper base member and a lower base member. The same kind of the sheath heater 102 as described above is placed in groove portions 107a formed in the region ranging from the metal lower base member 107 and the metal upper base member 108. All over the surfaces facing each other of the two base members are soldered, or soldered and diffusion bonded so as to be integrated into a unit.

FIG. 11 is a schematic plan view explaining the construction of the conventional press-forging type heater plate 111. In this construction, the metal base is also divided into two, i.e., an upper base member and a lower base member. Enclosing groove portions and corresponding enclosing protruding portions, each of which has a square, polygonal or circular cross section, are formed at least around the entire peripheries on the surfaces to be jointed of the aluminum base members 112, 113, and the two aluminum base members are fitted and press-forged so as to be metal bonded and sealed at the bonded portions 114.

Together with a large-sizing of the liquid crystal TV, the heater plate rapidly becomes larger in size and recently within a few years the size thereof changes from the fourth generation of 730 mm×920 mm through the fifth generation of 1100 mm×1300 mm, sixth generation of 1500 mm×1800 mm to the seventh generation of 2100 mm×2400 mm. The longer lifetime of the heater plate and the lower cost by the simplified manufacturing process are required together with the larger sizing of the heater plate.

In the constructions of the heater plate described above, the cast type heater plate has an excellent heat transfer property of the heater, since the sheath heater is closely contacted with the aluminum casting. However, since the thermal expansion coefficient of the metal such as the stainless steel, Incoloy (trademark) material or the like used for the protective pipe of the sheath heater and that of the aluminum metal base are different, the heater is deformed by the heat stress at the high temperature, the heater is broken by the repetitive use, and in some case, even the entirety of the heater plate is deformed.

In the bolt fastening type heater plate, there may exist gaps in the grooves, and the gaps function as heat insulating layers. In addition, since the members merely physically contacts each other, adhesiveness is low between the base members and the sheath heater, or the upper base member and the lower base member, thus deteriorating the heat transfer property. In some case, the temperature rises locally so as to damage the heater. The welding type heater plate has the same problem as those described above. Furthermore, the welding type heater plate has a large distortion by welding to have difficulty to maintain the original shape.

In the solder diffusion bonded type heater plate, since entire surfaces facing each other are pressed to be bonded under vacuum or nitrogen gas atmosphere, it is difficult to bond the large sized members, and in addition, there is necessitated the third joint member for bonding such as soldering, soft solder or the like.

In the press-forging type heater plate, since the size of the heater plate becomes larger, according to the method as disclosed in Japanese patent provisional publication No. 2000-311932 in which the recessed portions and the corresponding protruding portions are formed on the respective outer peripheral portions and in the vicinity of the heater in the plate members, and the recessed portions and the corresponding protruding portions are fitted and press-forging to be bonded, there appeared creep deformation by using for the long period of time at the high temperature range of 300 to 500 degree centigrade, and the outer peripheral portion, the vicinity of the heater or the inner portion thereof near the center of the plate member are deformed by the heat stress, thus the heater plate cannot be used anymore.

As described above, since the size of the heater plate becomes larger, the heater plate may be deformed and the cost for manufacturing the heater plate becomes higher. It is therefore necessary to improve the conventional press-forging method.

The present invention is made in view of the conventional technical problems described above. One of the objects of the present invention is to provide a heater plate and the method for manufacturing same in which the deformation of the heater plate by the heat stress can be effectively prevented, the heat transfer property thereof is excellent and the durability thereof is high.

SUMMARY OF THE INVENTION

The first embodiment of the heater plate of the invention is a heater plate manufactured by receiving a sheath heater within a groove portion formed in a base member made of aluminum or aluminum alloy, placing a joint member made of aluminum or aluminum alloy into said groove portion so as to fix said sheath heater in the groove portion, and press-forging said base member and said joint member to be metal-bonded with said sheath heater fixed in place therebetween, wherein a cross section of said joint member comprises a rectangle, and a width of said rectangle is same as or a little larger than a width of a cross section of the groove portion.

In the second embodiment of the heater plate of the invention, said joint member comprises a single member.

In the third embodiment of the heater plate of the invention, said joint member comprises a plurality of members arranged along a surface direction of said base member.

In the fourth embodiment of the heater plate of the invention, said joint member comprises a plurality of members arranged along a thickness direction of said base member.

In the fifth embodiment of the heater plate of the invention, a layout of said sheath heater is point-symmetrical in relation to a center point in a cross section or symmetrical in relation to one of two orthogonal center lines in a cross section of said base member.

In the sixth embodiment of the heater plate of the invention, said base material comprises a plate member.

In the seventh embodiment of the heater plate of the invention, a face of the joint member to contact with the sheath heater has a parallel face to a face of the base member or a curved face having a same curvature as an outer periphery of said sheath heater.

In the eighth embodiment of the heater plate of the invention, a width of a surface portion contacting with the sheath heater in the joint member is larger than a width of the sheath heater in cross section.

In the ninth embodiment of the heater plate of the invention, a height of said joint member is same as or larger than an effective depth of said groove portion obtained by subtracting a height of said sheath heater from a depth of said groove portion.

In the tenth embodiment of the heater plate of the invention, a cross sectional area of said joint member is larger than an effective cross sectional area obtained by subtracting a cross sectional area of said sheath heater from a cross sectional area of said groove portion.

In the eleventh embodiment of the heater plate of the invention, said sheath heater comprises a pipe configuration having a circular cross section or substantially rectangle (including square) with corner portions to be curved at a prescribed curvature, or a braided pipe configuration formed by braiding narrow sheets.

In the twelfth embodiment of the heater plate of the invention, said sheath heater is arranged one in each of a plurality of groove portions or a plurality of the sheath heaters are arranged in each of at least one groove portions formed in the base member.

In the thirteenth embodiment of the heater plate of the invention, said plurality of the sheath heaters are arranged in parallel in each of at least one groove portions formed in the base member.

In the fourteenth embodiment of the heater plate of the invention, said plurality of the sheath heaters are layered in a height direction in each of at least one groove portions formed in the base member.

In the fifteenth embodiment of the heater plate of the invention, a sheath portion of the sheath heater has an excellent heat conduction property to said joint member and said base member which receive the sheath heater.

In the sixteenth embodiment of the heater plate of the invention, said joint member and said base member in which the sheath heater is received are hermetically sealed.

In the seventeenth embodiment of the heater plate of the invention, the sheath heater has an excellent electrical insulation property to said joint member and said base member which receive the sheath heater.

In the eighteenth embodiment of the heater plate of the invention, said joint member and said base member comprise any one of alloy consisting of JIS1050, 1100, 3003, 3004, 5005, 5052, 6063, 6061, 7003, and 7N01, respectively.

The first embodiment of the method for manufacturing a heat plate is the method comprising the steps of:

receiving a sheath heater within a groove portion formed in a base member made of aluminum or aluminum alloy;

placing at least one joint member made of aluminum or aluminum alloy into said groove portion so as to fix said sheath heater in the groove portion; and press-forging said base member and said joint member to be metal-bonded with said sheath heater fixed in place therebetween, wherein a cross section of said joint member comprises a rectangle, and a width of said rectangle is same as or a little larger than a width of a cross section of the groove portion.

In the second embodiment of the method, a height of said joint member is same as or larger than an effective depth of said groove portion obtained by subtracting a height of said sheath heater from a depth of said groove portion.

In the third embodiment of the method, a ratio of said height to said width of said rectangle is within a range of from 1 to 4.

In the fourth embodiment of the method, said joint member comprises one member or a plurality of members.

In the fifth embodiment of the method, said joint member are divided into a plurality of member along a surface direction or a thickness direction of said base member.

In the sixth embodiment of the method, a cross sectional area of said joint member is larger than an effective cross sectional area obtained by subtracting a cross sectional area of said sheath heater from a cross sectional area of said groove portion.

In the seventh embodiment of the method, in case that said joint member are divided into a plurality of member, said plurality of members are forge-pressed in a prescribed order.

In the eighth embodiment of the method, said base member comprises a plate member.

In the ninth embodiment of the method, a face of the joint member to contact with the sheath heater is configured to be a flat face parallel to a plate face of the base member or a curved face having a same curvature as an outer periphery of said sheath heater.

In the tenth embodiment of the method, said joint member and said base member comprises any one of alloy consisting of JIS1050, 1100, 3003, 3004, 5005, 5052, 6063, 6061, 7003, and 7N01.

In the eleventh embodiment of the method, said press-forging is carried out at a temperature within a range of from 250 to 500 degree centigrade.

One embodiment of the method for preventing deformation of a heater plate is the method for preventing deformation of a heater plate applying the manufacturing method as described in the first embodiment of the method for manufacturing a heat plate.

One embodiment of the method for improving hermetical sealing is the method for improving hermetical sealing of the base member and the joint member by press-forging applying the method as described in the sixth embodiment of the method for manufacturing a heat plate.

One embodiment of the method for improving a lifetime of a heater is the method for improving a lifetime of a heater by applying the method as described in one embodiment of the method for improving hermetical sealing.

Other embodiment of the heater plate is the heater plate manufactured by receiving a sheath heater within a groove portion formed in a base member made of metal or metal alloy, placing joint member made of same kind of metal or metal alloy into said groove portion and fixing, and press-forging said base member and said joint member to be metal jointed.

In other embodiment of the heater plate, both of said base member and said joint member are copper or copper alloy.

BRIEF DESCRIPTION OF THE DRAWINGS

FIG. 1 is a schematic cross sectional view of the heater plate of one embodiment of the invention;

FIG. 2 is a schematic plan view of the heater plate of the invention;

FIG. 5 is a schematic plan view of the circular heater plate, FIG. 5(a) shows an arrangement of the heater which is symmetrical in relation to a line passing the center of the heater plate, and FIG. 5(b) shows an arrangement of the heater which is point-symmetric in relation to the center passing the axis.

DETAILED DESCRIPTION OF THE INVENTION

Figure 3:
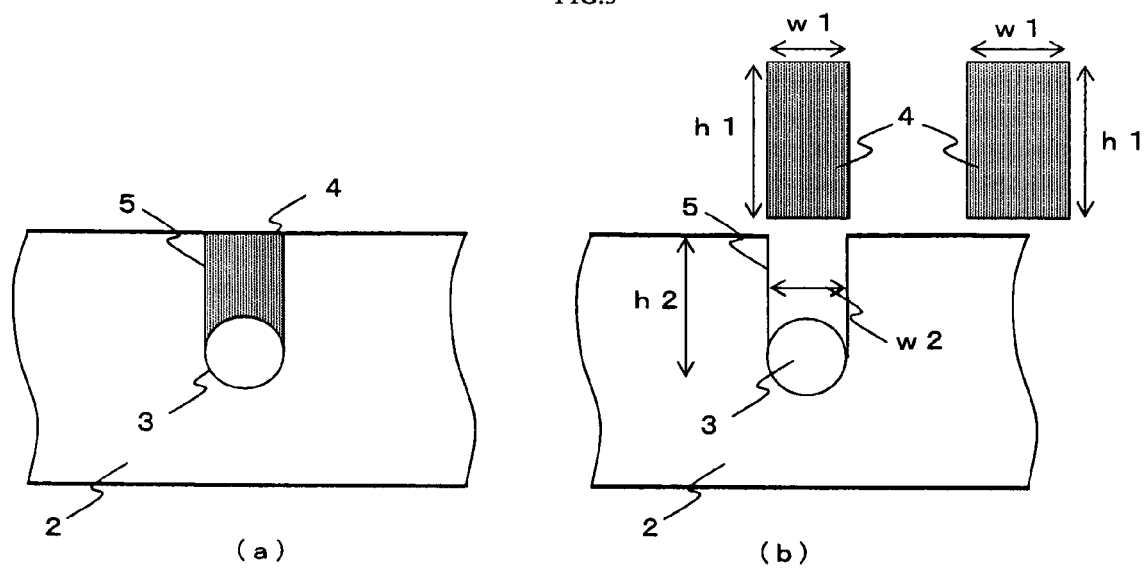
FIG. 3 is a schematic cross sectional view along A–A' in FIG. 2.

In the heater plate of the invention with the sheath heater embedded therein, the sheath heater is closely contacted with metal member so that the heat from the sheath heater is transferred to the metal member of the heater plate. In addition, the sheath heater is placed within the heater plate so as to uniformly heat the heater plate to a prescribed temperature. For example, the sheath heater is arranged in various configurations to uniformly heat the heater plate. The sheath heater comprises a heating wire and an insulating material enclosed within sheath member (i.e. pipe) made of stainless steel for example SUS304, nickel alloy for example Incoloy, or titanium. Number both of groove formed in the base member and the heater is appropriately selected according to the need, as described later.

The heater plate of the invention with the sheath heater embedded therein is used for a heater plate received in the vacuum container (i.e., vacuum chamber) of an apparatus manufacturing semiconductor or liquid crystal. FIG. 15 shows an example to use the heater plate with the sheath heater embedded therein. More specifically, FIG. 15 shows a schematic cross sectional view showing a CVD processing apparatus. The heater plate 121 with the sheath heater 123 embedded therein is supported by an supporting member 124 and arranged within a vacuum chamber 122. A substrate 125 is mounted on the heater plate 121. Furthermore, a gas supplying portion 126 is provided in the vacuum chamber for the CVD processing. The gas is supplied from the supply port 127 to fabricate a film on the substrate by means of the chemical vapor deposition.

Preferable embodiments of the invention are described with reference to the drawings.

FIG. 1 is a typical example of a schematic cross sectional view of the heater plate of one embodiment of the invention. As shown in FIG. 1, the heater plate 1 has a construction in which the sheath heater 3 as the inner component is received in the base member 2 made of aluminum or aluminum alloy, and the joint member 4 made of aluminum or aluminum alloy is placed on the base member in such a manner that the sheath heater is hermetically sealed by the joint member and the base member. FIG. 2 is a schematic plan view of the heater plate 1, and FIG. 3 is a schematic cross sectional view along A–A' in FIG. 2. Groove portion 5 is formed in the base member 2 made of aluminum or aluminum alloy to receive the sheath heater 3 and the joint member 4 made of aluminum or aluminum alloy. As the base member made of aluminum or aluminum alloy, a thick member may be used, but practically, a plate member is preferable.

The sheath heater 3 is received in the groove portion 5, then the joint member made of aluminum or aluminum alloy is received thereon, and then the base member and the joint member are press-forged to be bonded.

FIG. 3 is a schematic cross sectional view along A–A' in FIG. 2. There, a sheath heater is received within a groove portion formed in a base member made of aluminum or aluminum alloy, a joint member made of aluminum or aluminum alloy is placed into the groove portion so as to fix the sheath heater in the groove portion, and the base member and the joint member are press-forged to be metal-bonded. As shown in FIG. 3, the joint member 4 made of aluminum or aluminum alloy, the groove portion 5 of the base member made of aluminum or aluminum alloy and the sheath heater 3 are closely adhered each other by press-forging.

It is the feature of the invention that the cross section of the joint member 4 made of aluminum or aluminum alloy has a rectangular shape as shown in FIG. 3. As shown in FIG. 3(b), the width w1 in the cross section of the joint member 4 made of aluminum or aluminum alloy is the same as or larger than the width w2 in the cross section of the groove portion 5 of the base member 2 made of aluminum or aluminum alloy. In addition, as shown in FIG. 3(b), a ratio of the height h to the width w1 is preferably within a range of from 1 to 4, considering the buckling deformation or the like of the joint member. The ratio is more preferably within a range of from 1 to 3, considering the friction given from the side surface of the groove portion of the base member when press-forged. Although the ratio being up to 1 is possible, the ratio more than 1 is preferable considering the deformation by thermal stress or the strength of the bonded portion in the press-forged portion when the heater plate is used. Thus, the lower limit of the ratio is defined as being more than 1. The following shapes of the joint member is within a scope of the invention: the joint member in which the lower end portion thereof is cut to be narrower than the width of the groove portion in such manner that the lower end portion protrudes squarely downward (i.e., the cross section thereof comprises two rectangles with different widths placed vertically, the lower one being smaller than the upper one), and the joint member with the lower end slightly trimmed. It is required that the effective volume obtained by subtracting the volume of the sheath heater from the volume of the groove portion in the base member is larger than the volume of the joint member. It is also required that the length of the joint member is the same as or a little longer than the length required to secure a prescribed volume of the joint member to completely fill the groove portion.

The reason of defining the length of the joint member as described above is that the joint member is plastic-deformed while expanding the groove portion so that the joint member and the base member is metal-bonded by press-forging, when the width w1 in the cross section of the joint member is the same as or a little larger than the width w2 in the groove portion formed in the base member 2. More practically, in case that the sheath heater having the diameter of 10φ, the width in the groove portion of the base member may be 11 mm, and the width in the cross section of the joint member may be about 12 mm. More specifically, it is required that the joint member having a width a little larger than the width in the groove portion of the base member is used so that the joint member is plastic-deformed while receiving the compressive stress from the wall of the groove portion so as to be metal-bonded. The difference between the width of the joint member to be inserted into the groove portion and the width of the groove portion may be accepted up to the maximum in which the joint member can be inserted into the groove portion. The maximum is considered as up to be larger than the width of the groove portion by a few mm. As described above, the ratio of the height h1 to the width w1 in FIG. 3 (b) is preferably within a range of from 1 to 4, and more preferably from 1 to 3.

Also, as described above, the effective volume obtained by subtracting the volume of the sheath heater from the volume of the groove portion in the base member is larger than the volume of the joint member. In addition, the length of the joint member is the same as or a little longer than the length required to secure a prescribed volume of the joint member to completely fill the groove portion. The reason of defining as described above is that without satisfying the condition, it is difficult to completely fill the groove portion in the base member by the joint member and to be metal-bonded with the base member.

Figure 4:
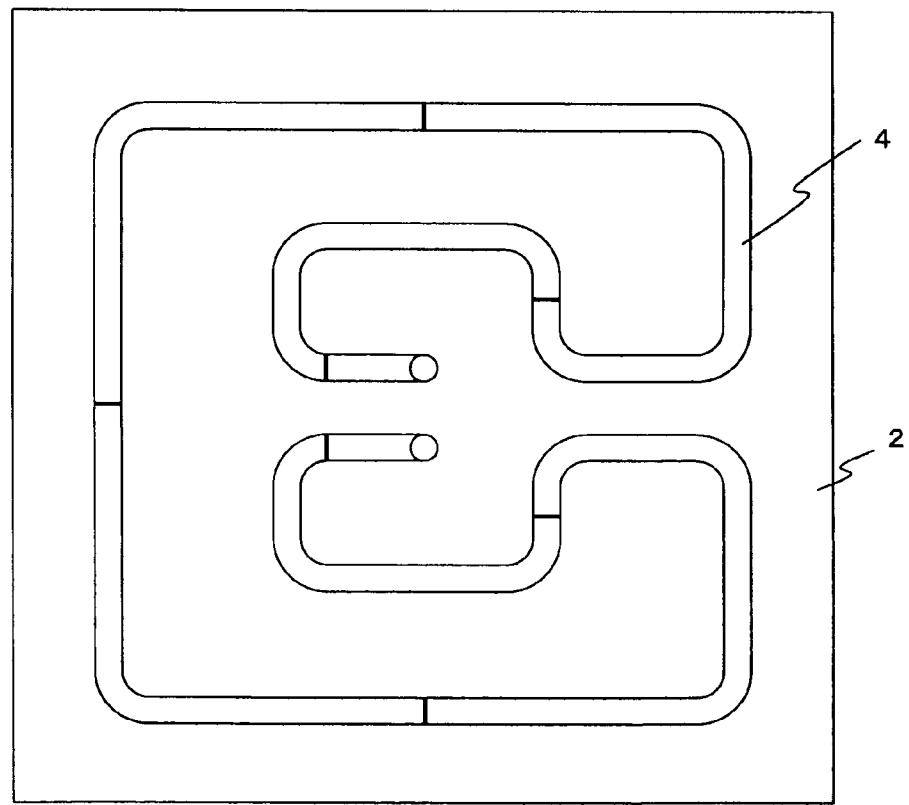
FIG. 4 is a schematic plan view of the heater plate of other embodiment of the invention.

FIG. 2 shows an example of the joint member comprising an integrated member. FIG. 4 shows an example of the joint member comprising a plurality of members divided along the surface of the base member 2. Accordingly, the joint member 4 is not limited to be an integrated member (i.e., single member). The joint member made of aluminum or aluminum alloy may be divided into a plurality of members as shown in FIG. 4 to be press-forged, if necessary.

A shape of the heater plate of the invention may be rectangular as shown in FIG. 2, and in addition may be circular as shown in FIG. 5. It is preferable that the shape (i.e., layout) of the heater plate is symmetrical in relation to one of two orthogonal center lines in the cross section or point-symmetrical in relation to the center point in the cross section thereof. More specifically, the heater plate is symmetrical in relation to the center line 6 in FIG. 2, and the center line 51 in FIG. 5(a), whereas the heater plate is point-symmetrical in relation to the center point 53 in FIG. 5(b). In case that the joint member made of aluminum or aluminum alloy of the invention has a rectangular cross section, the end portion of the joint member to be contacted with the sheath heater may be slightly chamfered, thus it is easy to align the joint member to the base member.

Although it is not shown, it is possible to place two heaters in parallel in the groove portion formed in the base member made of aluminum or aluminum alloy in the same manner as the layout described in FIG. 2, FIG. 5(a) and FIG. 5(b). It is also possible to place two heaters in layers in the depth direction of the groove. Thus, a plurality of heaters can be received in at least one groove portions to prepare the heater plate. Furthermore, each heater may be placed in one groove portion respectively to prepare the heater plate. The groove portion to receive the sheath heater is designed in such manner that the heater plate may be uniformly heated to a prescribed temperature. It is possible to appropriately select the number of the groove and the heater.

In the joint member 4 made of aluminum or aluminum alloy as shown in FIG. 3, a face of the joint member to directly contact with the sheath heater in the cross section is configured to be a flat face parallel to a plate face of the base member or a curved face having the same curvature as the outer periphery of the sheath heater in the same direction.

Figure 6:
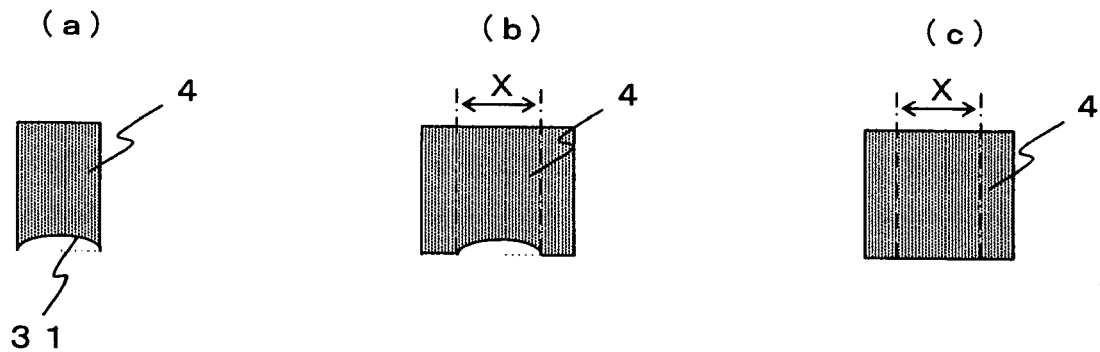
FIG. 6 is a schematic cross sectional view of the joint member made of aluminum or aluminum alloy.
Figure 7:
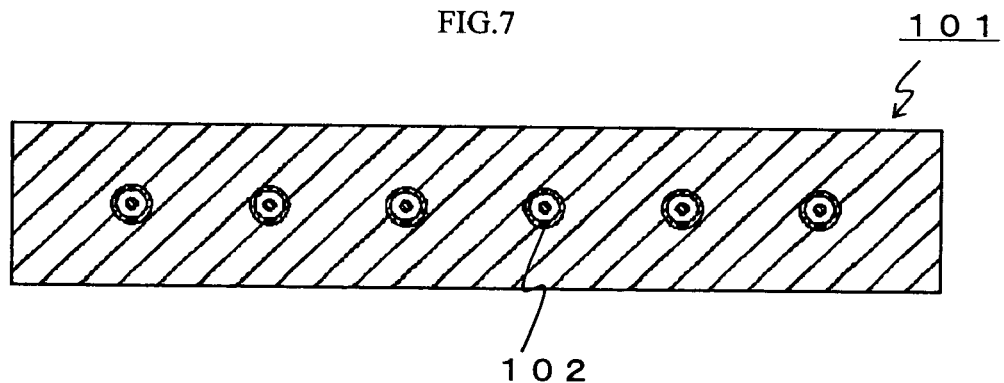
FIG. 7 is a schematic cross sectional view showing a conventional cast type heater plate with the sheath heater embedded.
Figure 8:
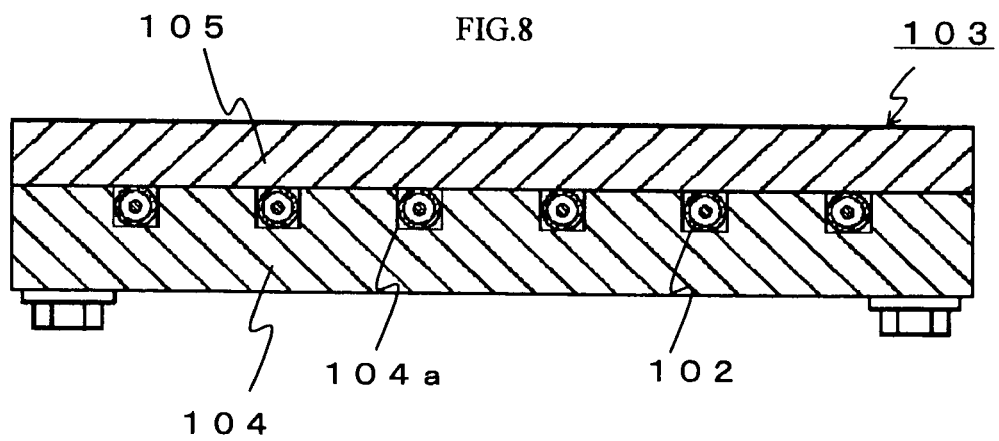
FIG. 8 is a schematic cross sectional view showing the conventional bolt fastening type heater plate.
Figure 9:
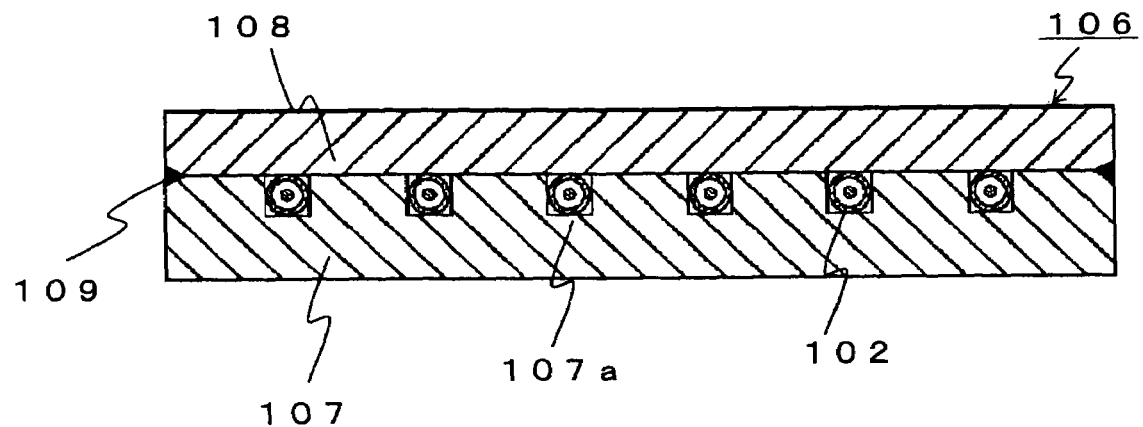
FIG. 9 is a schematic cross sectional view showing the conventional welding type heater plate.
Figure 10:
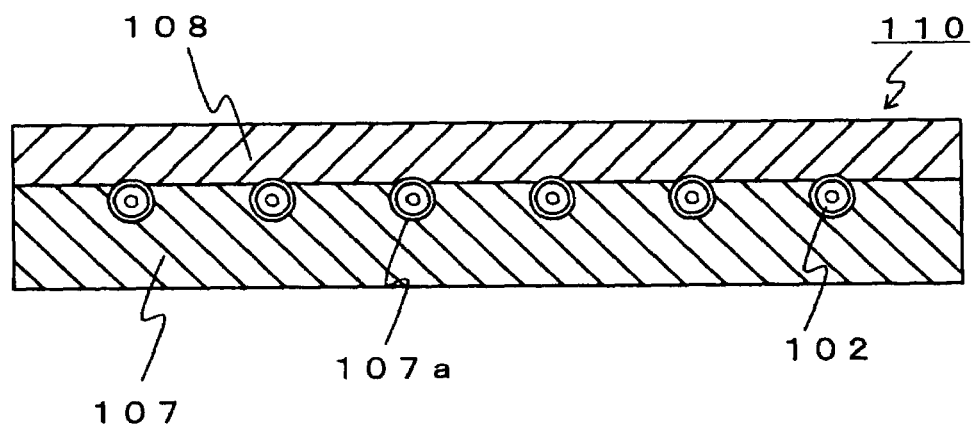
FIG. 10 is a schematic cross sectional view showing the conventional solder, diffusion bonded type heater plate.
Figure 11:
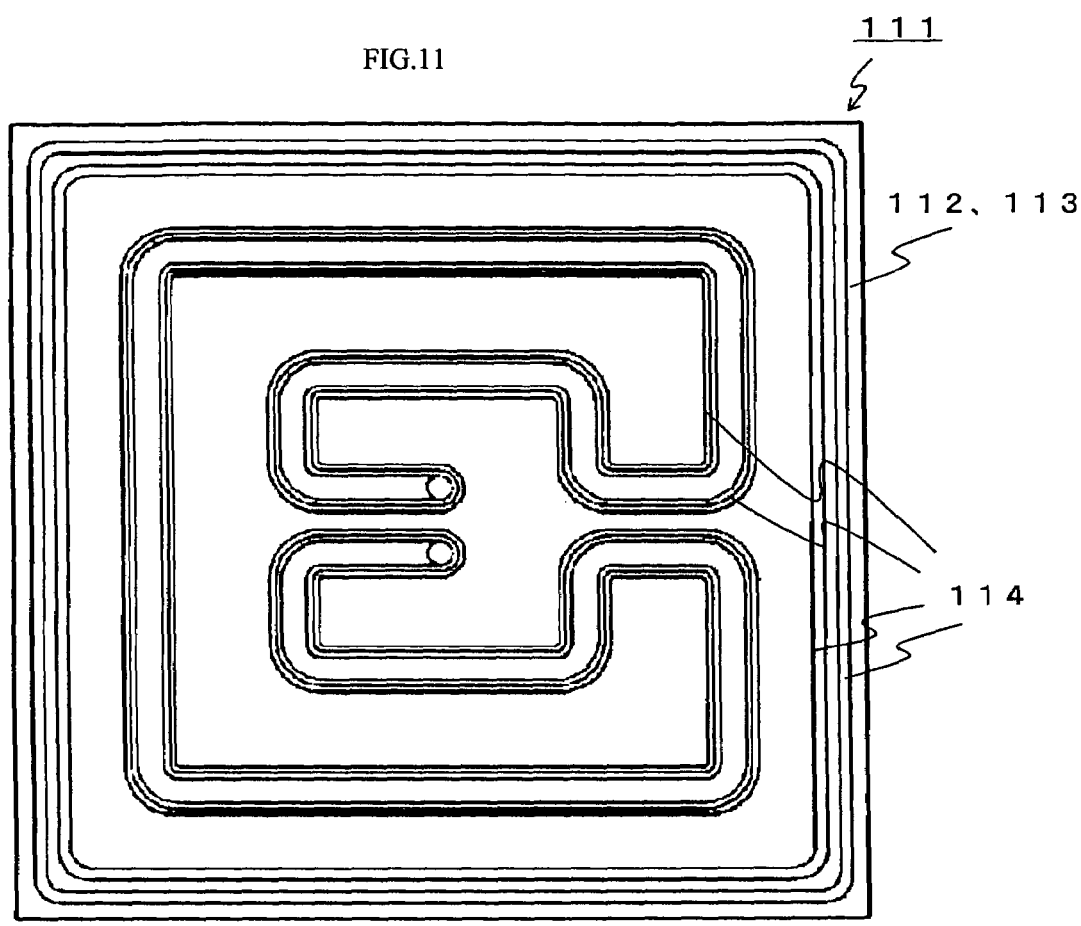
FIG. 11 is a schematic plan view explaining a press-forging type heater plate.
Figure 12:
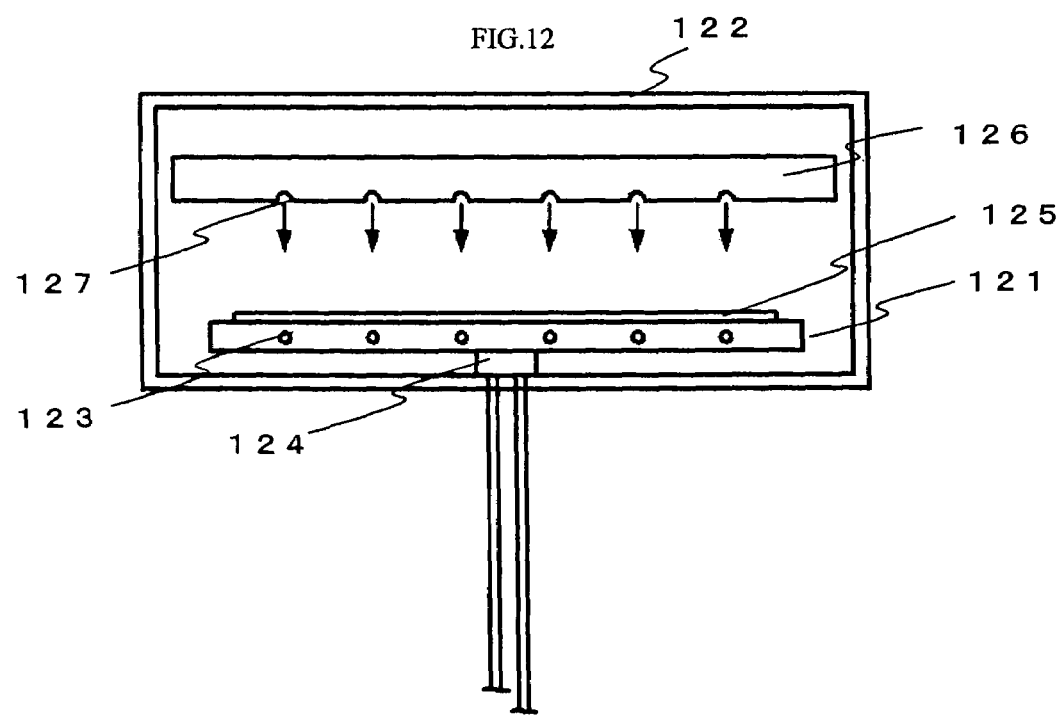
FIG. 12 is a schematic cross sectional view showing a CVD processing apparatus with the sheath heater arranged therein.

FIG. 6 shows an example in which the face of the joint member made of aluminum or aluminum alloy to directly contact with the sheath heater has a curved face having the same curvature as the outer periphery of the sheath heater in the same direction. Since the face of the joint member to directly contact with the sheath heater 3 has the shape as described above, the gap between the base member 2, the joint member 4 and the sheath heater is reduced to the minimum so that the base member and the joint member are metal-bonded with the sheath heater tightly embedded therebetween, thus obtaining the highly hermetic and excellent thermal conductive heater plate. Furthermore, no damage is inflicted on the sheath portion upon metal bonding, so that the insulating material within the sheath heater is protected so as to maintain high electric insulation. FIG. 6 shows the case in which the face of the joint member 4 to contact with the sheath heater in cross section has the same curvature as the outer periphery of the sheath heater, and the width of the joint member is larger than the width of the sheath heater X. Since the width of the joint member is larger than the width of the sheath heater, the flow of the material into the outer periphery portion of the sheath heater is secured upon metal bonding, so that the adhesiveness of the joint member to the sheath heater is improved. FIG. 6(c) shows the case in which the face of the joint member is parallel to the plate surface of the base member in cross section. Since the width of the joint member is larger than the width X of the sheath heater and the lowest portion of the joint member is parallel to the plate surface of the base member, the flow of the material into the outer periphery portion of the sheath heater upon press-forging is effectively carried out compared to the case in which the face of the joint member to contact with the sheath heater has the same curvature as the outer periphery of the sheath heater. When the width of the joint member is made larger, the width of the groove portion in the base member is correspondingly made larger (i.e., the enlarged width of the joint member corresponds to the enlarged width of the groove portion).

Any one of alloy consisting of JIS1050, 1100, 3003, 3004, 5005, 5052, 6063, 6061, 7003, and 7N01 may be used for the base member 2 and the joint member 4 made of aluminum or aluminum alloy of the heater plate of the invention.

As other embodiment of the heater plate of the invention, the sheath heater may comprises a pipe configuration having a circular cross section or substantially rectangle (including square) with corner portions to be curved at a prescribed curvature, or a braided pipe configuration formed by braiding narrow bars.

Then, a method for manufacturing the heater plate is described.

In the heater plate 1 of the present invention, the groove portion is formed in the base member 2 made of aluminum or aluminum alloy in which the sheath heater 3 as an inner component and the joint member 4 made of aluminum or aluminum alloy are inserted. After the sheath heater 3 is received in the groove portion 5, the joint member to fill the space in the groove portion is inserted thereon. Then, the joint member and the base member made of aluminum or aluminum alloy are metal-bonded by press-forging to manufacture the heater plate. The base member made of aluminum or aluminum alloy may be aluminum alloy plate.

In the method for manufacturing the heater plate of the invention, it is preferable that the joint member made of aluminum or aluminum alloy has a rectangular cross section, and the width w1 of the joint member in cross section is the same as or larger than the width w2 of the groove portion 5 in cross section formed in the base member made of aluminum or aluminum alloy. Due to the above-mentioned features, the joint member 4 and the base member 2 is forge-pressed to be metal-bonded without gap between the side surface of the groove portion 5 and the side surface of the joint member 4.

In the method for manufacturing the heater plate of the invention, it is preferable that the height h1 of the joint member is larger than the value obtained by subtracting the width of the sheath heater from the depth h2 of the groove portion 5 in the base member 2, as shown in FIG. 3, so that the hermetic bonding between the bottom face of the joint member and the sheath heater is remarkably improved by press-forging. In addition, in the method for manufacturing the heater plate of the invention, a ratio of the height h to the width w1 is preferably within a range of from 1 to 4, more preferably from 1 to 3.

In the method for manufacturing the heater plate, it is preferable to clean the surface of the members as a step of the pre-treatment. In case of aluminum or aluminum alloy for example, it is preferable to clean the surfaces of the members by appropriately combining the steps of (1) removing oil from the surface by nitric acid, (2) water washing, (3) caustic treatment (etching by alkali solution), (4) water washing, (5) cleansing by nitric acid, (6) water washing, (7) hot-water washing and the like. This is because the bonding efficiency is improved by cleaning the surfaces of the members before press-forging.

Furthermore, as a finishing process after press-forging the base member 2 and the joint member 4 made of aluminum or aluminum alloy, cutting, grinding, alumite treatment and shot blasting are preferable. Due to the cutting after press-forging, the deformation can be removed of the heater plate near the pressed portion on the pressing face which is caused by the joint member excessively pressed in the groove portion over the effective volume in the base member by the treatment followed such as grinding or the like.

The base member 2 and the joint member 4 are press-forged to be metal-bonded at the temperature within a range of from 250 to 500 degree centigrade, preferably from 300 to 450 degree centigrade, more preferably from 350 to 420 degree centigrade. It is the merit that the press-forging is carried out for a very short time comparing to the welding, particularly when the joint member is an integrated member.

After press-forging, the heater plate is naturally cooled to a room temperature. Then, although the stress is built in the heater plate due to the contraction difference between the base member made of aluminum or aluminum alloy and the sheath heater made of stainless steel, the heater plate is not deformed since the proof strength of the base member at room temperature is large. In addition, the sheath heater is not deformed or damaged, since the strength of the sheath heater made of stainless steel is high. More specifically, the heater plate is formed by press-forging at the temperature around 400 degree centigrade, and when used, the heater plate is heated to the temperature around 400 degree centigrade (i.e., the temperature range for usage is around 400 degree centigrade). This means that the heater plate returns to the situation in which the press-forging is just finished. The stress built between the members made of aluminum and the sheath heater made of stainless steel therefore becomes very small, thus there is no fear that the heater plate is deformed or the sheath heater is deformed or damaged.

In the method for manufacturing the heater plate of the invention, as aluminum or aluminum alloy used for the base member and the joint member, any one of JIS1050, 1100, 3003, 3004, 5005, 5052, 6063, 6061, 7003, and 7N01 may be selected. Although the material and process of aluminum or aluminum alloy base member 2 are not specifically limited, it is preferable to use the rolled plate or forged product which has few inner defect, considering a leak resistance thereof. As the aluminum material, JIS1050 having at least 99.5% purity is most preferable, in view of the corrosion resistance to the cleansing gas. Although the alloy having higher strength than 1100, 6061 or the like comes to be used, considering the prevention of the creep deformation according to the large sizing of the heater plate, the aluminum or aluminum alloy listed above may be used too. In addition, Al—Mg alloy such as 5005, 5052 or the like which contains low magnesium satisfies press bonding property, therefore the alloy can be used in a specific composition range to secure the effective metal bonding.

When the base member 2 and the joint member 4 made of aluminum or aluminum alloy are the same material, both materials are press bonded by the deformation due to press-forging, thus physically the metal bonding is easily produced. Even when the base member 2 and the joint member 4 made of aluminum or aluminum alloy are different materials, both materials are press bonded by the deformation due to press-forging, thus physically metal bonded. For example, different materials of aluminum material of JIS1000 series and aluminum material of JIS3000 series are physically metal-bonded.

When the joint member 4 made of aluminum or aluminum alloy to fill the groove portion 5 are divided into a plurality of members along the surface of the base member 2 made of aluminum or aluminum alloy, as shown in FIG. 4, it is possible to forge-press either all the members at once, or one member at a time in a prescribed order. When divided members are forge-pressed one member at a time, the portion to be forge-pressed at one time becomes small so that a small pressing machinery is applicable.

In this case, in each of plurality of joint member made of aluminum or aluminum alloy, the upper surface of the member is longer than the lower surface of the member, and end surfaces of the joint member have respective tapered portions, in addition, the upper surface of the joint member is longer than the length of the groove portion for embedding the heater in the base member, thereby the plurality of joint members apply pressure each other to cause plastic-deform and metal-bonded by press-forging, thus boundaries of the plurality of joint members can be fully metal-bonded by press-forging. The bonding between the joint member and the base member is carried out preferably only by the press-forging so that the manufacturing steps are simplified. However, each end portion of the plurality of joint members is bonded by electronic beam welding or soldering, and thus bonded plurality of joint members which length is shorter than that of the groove portion in the base member can also be applied.

In a method for manufacturing the heater plate 1 of the invention, it is preferable that a face of the joint member to contact with the sheath heater is configured to be a parallel face to a face of the base member or a curved face having a same curvature in the same direction as an outer periphery of the sheath heater.

According to the method for manufacturing the heater plate of the invention described above, the close adhesion between the base member 2 and the sheath heater 3 is more improved to result in remarkable improvement in the heat transfer property from the sheath heater 3 to the base member made of aluminum or aluminum alloy, thus the lifetime of the sheath heater is lengthened. In addition, in the method for manufacturing the heater plate 1 of the invention, since the press-forging is implemented at the temperature of around 400 degree centigrade which is the temperature the heater plate is used, the stress built between the aluminum material and the stainless steel sheath material is very small, thus the heater plate can be used for a long period of time without producing distortion in the heater plate.

In the present invention, two aluminum or aluminum alloy plates are not metal-bonded by press-forging, but only the portion in which the sheath heater is embedded is forge-pressed to be metal-bonded, thereby preventing the deformation by the thermal stress of the heater plate. Therefore, even if the heater plate becomes large, only the vicinity of the sheath heater is forge-pressed, thus the power of the press-forging machinery can be reduced comparing to the conventional bonding by pressing entire of the plates. The area in the material to be pressed by pressing machinery may be smaller, thus it is possible to avoid the large sizing of the pressing machinery, and furthermore, to save the working troubles comparing to press-forging the entire plates.

According to the invention, the sheath heater and the joint member made of aluminum or aluminum alloy are received in the groove portion formed in the base member made of aluminum or aluminum alloy, and the joint member and the base member are press-forged to be metal-bonded, thus high hermetical sealing can be maintained between the base member and the sheath heater, resulting in obtaining more higher heat transfer property.

According to the invention, since the metal bonding by press-forging of the joint member and the base member is carried out at the temperature of around the heating region in which the heater plate is used, the stress due to linear expansion difference between the base member made of aluminum or aluminum alloy and the sheath material of the inner heater can be reduced, thus preventing deformation or damage of the sheath heater, deformation of the heater plate or the like. At the same time, the close adhesion and heat transfer property between the joint member and the base are improved.

The technique of the invention is applied to aluminum or aluminum alloy material, however this is not limited to the aluminum or aluminum alloy material. As far as the metal joint member and the metal base member can be metal-bonded by press-forging, and excellent heat transfer property can be obtained, any metal material can be used. As the metal material, the material having a large linear expansion efficiency is more preferable, considering the lifetime of the heater.

Copper or copper alloy can be listed as the material which can be forge pressed to be metal bonded, has excellent heat transfer property, and has a large linear expansion coefficient. The same heater plate as described above can be obtained by using copper or copper alloy material. It is preferable that the press-forging to be metal-bonded is carried out at the temperature within a range of from 700 to 900 degree centigrade, when the heater plate is manufactured by using copper or copper alloy material.

Accordingly, the heater plate of the invention is manufactured by the following steps, i.e., the sheath heater is received in the groove portion formed in the metal or metal alloy base member, the same metal or metal alloy joint member is fitted to the groove portion, and the joint member and the base member are metal-bonded by press-forging. As the metal material, those metal as having a low press-forging temperature and light weight are preferable, considering the heat transfer property, linear expansion coefficient, in addition, workability and easy handling. For this purpose, aluminum or aluminum alloy is excellent, thus in the invention, aluminum or aluminum alloy is used for both of the joint member and the base member.

What is claimed is:

1. A heater plate manufactured by receiving a sheath heater within a groove portion formed in a base member made of aluminum or aluminum alloy, placing a joint member made of aluminum or aluminum alloy into said groove portion so as to fix said sheath heater in the groove portion, and press-forging said base member and said joint member to be metal-bonded wit said sheath heater fixed in place therebetween, wherein a cross section of said joint member comprises a rectangle with a flat bottom face or a curved concaved bottom face, radius of said curved concaved bottom face is larger than radius of an outer periphery of said sheath heater, and a width of said rectangle is larger than a width of a cross section of the groove portion.

2. The heater plate as claimed in claim 1, wherein maid joint member comprises a single member.

3. The heater plate as claimed in claim 1, wherein said joint member comprises a plurality of members arranged along a surface direction of said base member.

4. The heater plate as claimed in claim 1, wherein said joint member comprises a plurality of members arranged along a thickness direction of said base member.

5. The heater plate as claimed in claim 1, wherein a layout of said sheath heater is point-symmetrical in relation to a center point in a cross section or symmetrical in relation to one of two orthogonal center lines in a cross section of said base member.

6. The heater plate as claimed in claim 5, wherein said base member comprises a plate member.

7. The heater plate as claimed in claim 1, wherein a width of a surface portion contacting with the sheath heater in the joint member is larger than a width of the sheath heater in cross section.

8. The heater plate as claimed in claim 1, wherein a height of said joint member is same as or larger than an effective depth of said groove portion obtained by subtracting a height of said sheath heater from a depth of said groove portion.

9. The heater plate as claimed in claim 1, wherein a cross sectional area of said joint member is larger than an effective cross sectional area obtained by subtracting a cross sectional area of said sheath heater from a cross sectional area of said groove portion.

10. The heater plate as claimed in claim 1 wherein said sheath heater comprises a pipe configuration having a circular cross section or substantially rectangle (including square) with corner portions to be curved at a prescribed curvature, or a braided pipe configuration formed by braiding narrow sheets.

11. The heater plate as claimed in claim 1, wherein said sheath heater is arranged in each of a plurality of groove portions or a plurality of the sheath heaters is arranged in at least one of the groove portions formed in the base member.

12. The heater plate as claimed in claim 11, wherein said plurality of the sheath heaters is arranged in parallel in at least one of the groove portions formed in the base member.

13. The heater plate as claimed in claim 11, wherein said plurality of the sheath heaters is layered in a height direction in at least one of the groove portions formed in the base member.

14. The heater plate as claimed in claim 1, wherein a sheath portion of the sheath heater has an excellent heat conduction property to said joint member and said base member which receive the sheath heater.

15. The heater plate as claimed in claim 1, wherein said joint member and said base member in which the sheath heater is received are hermetically sealed.

16. The heater plate as claimed in claim 1, wherein the sheath heater has an excellent electrical insulation property to said joint member and said base member which receive the sheath heater.

17. The heater plate as claimed in claim 1, wherein said joint member and said base member comprise any one of alloy consisting of JIS1050, 1100, 3003, 3004, 5005, 5052, 6063, 6061, 7003, and 7N01, respectively.

18. A method for manufacturing a heat plate comprising:
receiving a sheath heater within a groove portion formed in a base member made of aluminum or aluminum alloy,
placing at least on joint member made of aluminum or aluminum alloy into said groove portion so as to fix said sheath heater in the groove portion; and
press-forging said base member and said joint member to metal joint same with said sheath heater fixed in place therebetween,
wherein a cross section of said joint member comprises a rectangle with a flat bottom face or a curved concaved bottom face, radius of said curved concaved bottom face is larger than radius of an outer periphery of said sheath heater, and a width of said rectangle is larger than a width of a cross section of the groove portion.

19. The method as claimed in claim 18, wherein a height of said joint member is same as or larger than an effective depth of said groove portion obtained by subtracting a height of said sheath heater from a depth of said groove portion.

20. The method as claimed in claim 18, wherein a ratio of said height to said width of said rectangle is within a range of from 1 to 4.

21. The method as claimed in claim 18, wherein said joint member comprises one member or a plurality of members.

22. The method as claimed in claim 18, wherein said joint member are divided into a plurality of members along a surface direction or a thickness direction of said base member.

23. The method as claimed in claim 18, wherein a cross sectional area of said joint member is larger than an effective cross sectional area obtained by subtracting a cross sectional area of said sheath heater from a cross sectional area of said groove portion.

24. The method as claimed in claim 18, wherein in case that said joint member is divided into a plurality of members, said plurality of members is forge-pressed at once or in a prescribed order.

25. The method as claimed in claim 18, wherein said base member comprises a plate member.

26. The method as claimed in claim 18, wherein said joint member and said base member comprises any one of alloy consisting of JIS1050, 1100, 3003, 3004, 5005, 5052, 6063, 6061, 7003, and 7N01.

27. The method as claimed in claim 18, wherein said press-forging is carried out at a temperature within a range of from 250 to 500 degree centigrade.

28. A method for preventing deformation of a heater plate applying the manufacturing method as claimed in claim 18.

29. A method for improving hermetical sealing of the base member and the joint member by press-forging applying the method as claimed in claim 23.

30. A method for improving a lifetime of a heater by applying the method as claimed in claim 29.

31. A heater plate manufactured by receiving a sheath heater within a groove portion formed in a base member made of metal or metal alloy, placing joint member made of name kind of metal or metal alloy into said groove portion and fixing, and press-forging said base member and said joint member to be metal jointed, wherein a cross section of said joint member comprises a rectangle with a flat bottom face or a curved concaved bottom face, radius of said curved concaved bottom face is larger than radius of an outer periphery of said sheath heater, and a width of said rectangle is larger than a width of a cross section of said groove portion.

32. The heater plate as claimed in claim 31, wherein both of said base member end said joint member are copper or copper alloy.

* * * * *